United States Patent [19]

Rizzo

[11] Patent Number: 4,500,394
[45] Date of Patent: Feb. 19, 1985

[54] CONTACTING A SURFACE FOR PLATING THEREON

[75] Inventor: John S. Rizzo, Birdsboro, Pa.

[73] Assignee: AT&T Technologies, Inc., New York, N.Y.

[21] Appl. No.: 610,737

[22] Filed: May 16, 1984

[51] Int. Cl.³ .................... C25D 5/02; C25D 17/08
[52] U.S. Cl. ................................ 204/15; 204/297 W
[58] Field of Search ................... 204/15, 23, 297 W

[56] References Cited

U.S. PATENT DOCUMENTS

| | | | |
|---|---|---|---|
| 3,658,663 | 4/1972 | Fukanuma et al. | 204/15 |
| 4,100,054 | 7/1978 | DuRocher | 204/297 |
| 4,385,978 | 5/1983 | Prusak | 204/281 |

*Primary Examiner*—Thomas Tufariello
*Attorney, Agent, or Firm*—D. C. Watson

[57] ABSTRACT

An article such as a semiconductor wafer (12) is contacted for plating on an active surface (16). Disposed adjacent to and around the surface (16), there is a conductor such as an annular ring (58) which is adapted for connection to a current source. A composite member (62) has an outer portion (64) for contacting the conductor ring (58) and an inner portion (63) for contacting peripheral regions of surface (16) of the wafer (12). Each of the portions (64 and 63) have a substantially nonconductive matrix supporting a plurality of conductive elements having first and second ends. The first ends of the elements in the outer portion (64) are for contacting the conductor (58) and the first ends of the elements in the inner portion are for contacting the surface (16). A coupling member such as a compliant metal foil (66) is contacted to and interconnects the second ends of the elements in the inner and outer portions (63 and 64). Conductive paths are completed from conductor (58) to the surface (16) and the matrix material is compressible to seal the periphery of the wafer (12) to contain ensuing plating to the surface (16).

12 Claims, 3 Drawing Figures

4,500,394

CONTACTING A SURFACE FOR PLATING THEREON

TECHNICAL FIELD

This invention relates to electrically contacting for plating on a given surface of an article. More particularly, the invention relates to plating on a surface utilizing a plurality of contact elements supported by a compressible matrix which seals against peripheral regions of the surface.

BACKGROUND OF THE INVENTION

In the solid state electronics industry, a multitude of devices such as integrated circuits (ICs) are typically formed in an active surface of a semiconductor wafer. Such forming includes plating metal on an active surface to establish current paths, contact pads, leads and other features of the devices. A problem is to properly plate on the active surface only and not on a reverse, inactive side or on other surfaces.

Such plating is advantageously accomplished by a process sometimes referred to as high velocity plating. Each wafer is held in a pocket of a vertically oriented holder board which is immersed in a plating bath. The inactive surface of a wafer is sealed off to avoid unwanted wetting, and the wafer is electrically connected to the cathode terminal of a rectifier. A pump and jet assembly is utilized to propel streams of solution primarily onto the active surface of a wafer. Typically, there is a disposed in the solution stream, a metallic grid which is electrically connected to the anode terminal of a rectifier to complete a current path via the grid through the solution stream to the active surface. A continual stream of solution impinging upon the active surface expedites ion exchange and electroplating is thereby enhanced. A problem is to hold a wafer firmly against the pressure of a solution stream. Another problem is to effectively seal around an active surface so solution does not wet, plate and/or corrode other surfaces. A further problem is to achieve good contact to deliver a desired current to an active surface without damaging the wafer.

The inactive surface of a wafer is generally inappropriate for electrical contact because of the desire to keep such surface unwetted and because dielectric layers such as silicon nitride are often present. Consequently, peripheral regions of the active surface are contacted, typically utilizing pointed pins made of a metal which tolerates the usually corrosive environment. A problem is that the pointed pins often damage a wafer under efforts to achieve good contact. Another problem is that the metal pins become parasitically plated and must be cleaned. A further problem is that metals which are inherently good conductors often donate unwanted impurities to plating solutions.

Accordingly, it is desirable to develop new and improved expedients for plating on a surface, especially on an active surface of a semiconductor wafer. Such wafers are easily broken and should be softly coupled to a current source with sealing contacting members without exposing metal surfaces to plating solutions.

SUMMARY OF THE INVENTION

Expedients are provided for plating on a first surface of an article such as an active surface of a semiconductor wafer. A conductor such as a flat metal ring is disposed around and adjacent to the peripheral edge of the wafer and the ring may be connected to the cathode terminal of a rectifier. A composite member is advantageously utilized for contacting the conductor and the active surface of the wafer. An outer portion of the composite member may be contacted to the conductor ring and an inner portion of the member may be contacted to peripheral regions of the active surface. Both portions advantageously have a matrix supporting a plurality of conductive elements such as wires. The matrix is substantially nonconductive to avoid unwanted plating on exposed surfaces of the composite member.

In one embodiment, the wire elements may be oriented substantially normal to flat surfaces of the ring and the active surface of the wafer. The wires may have a wavy alignment which makes them longitudinally compressible and resilient. First ends of the wires in the outer portion of the composite member are contacted to the conductor. First ends of the wires in the inner portions are contacted to the active surface of the wafer.

In another embodiment, at least one coupling member such as compliant metal foil is contacted to and interconnects the second ends of the wires in both the inner and outer portions of the composite member. Conductive paths are thereby advantageously completed from the ring conductor through the wires in the outer portion to the foil and from the foil through the wires in the inner portion to the active surface.

BRIEF DESCRIPTION OF THE DRAWING

The invention will be more readily understood from the following detailed description when read in conjunction with the drawing wherein.

Figure 1:
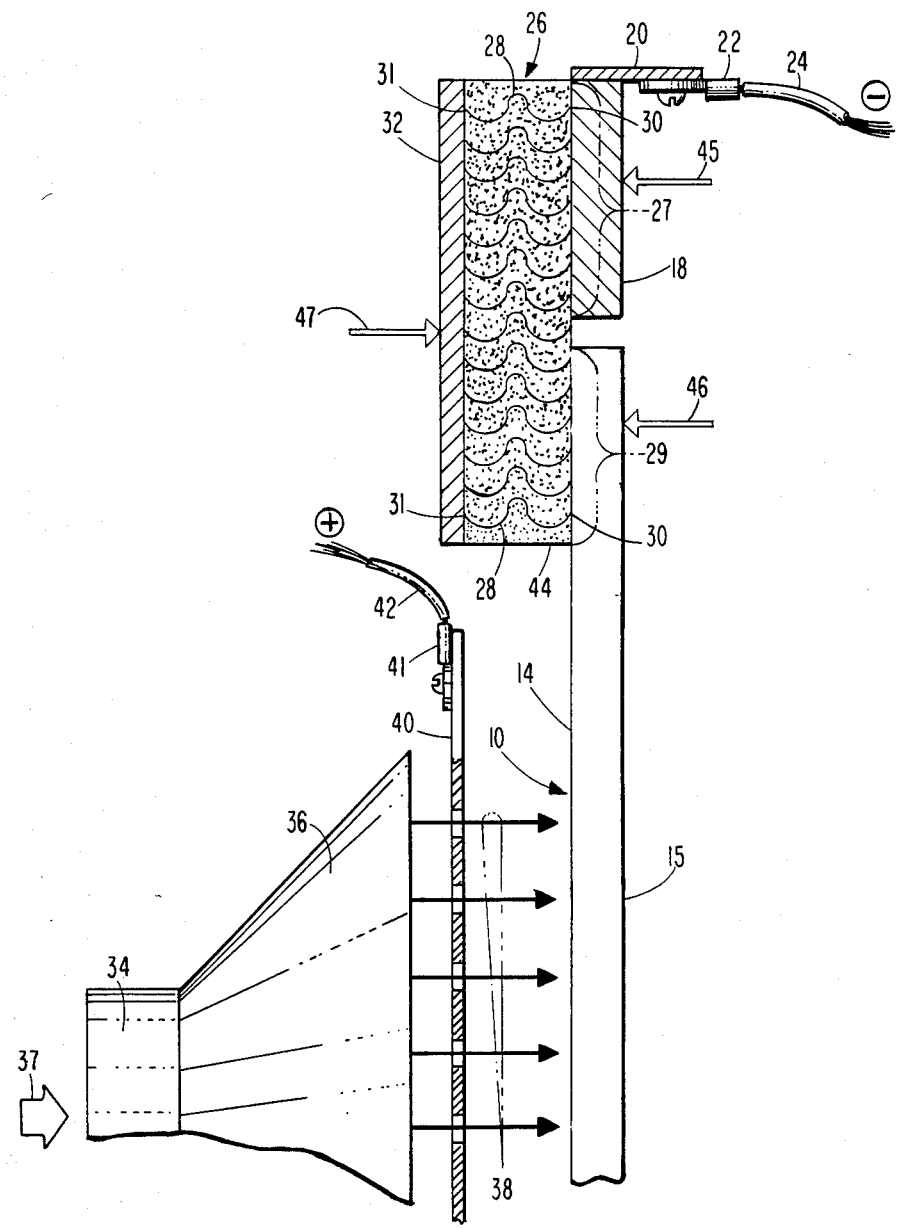
FIG. 1 is a schematic representation of expedients for plating on a given surface in accordance with the invention.

Some of the elements in the figures are abbreviated or simplified to highlight features of the invention. Also, where appropriate, reference numerals have been repeated in the figures to designate the same or corresponding features in the drawing.

DETAILED DESCRIPTION

The Articles And Surfaces

Figure 2:
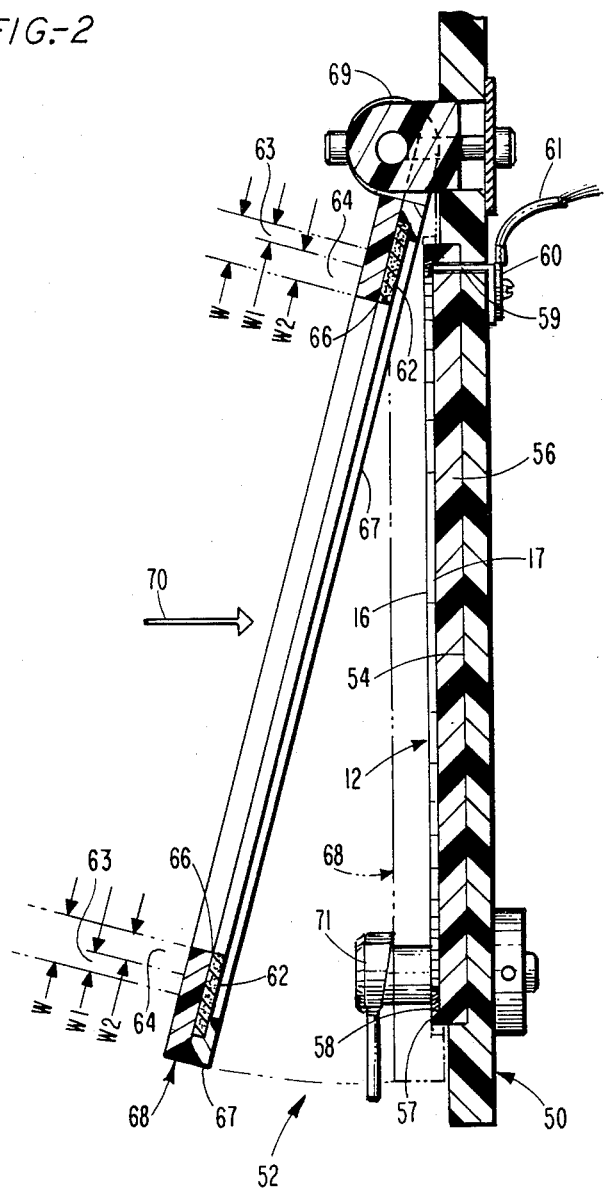
FIG. 2 is a sectional view of a wafer and apparatus for plating on an active surface of the wafer in accordance with one embodiment of the invention.
Figure 3:
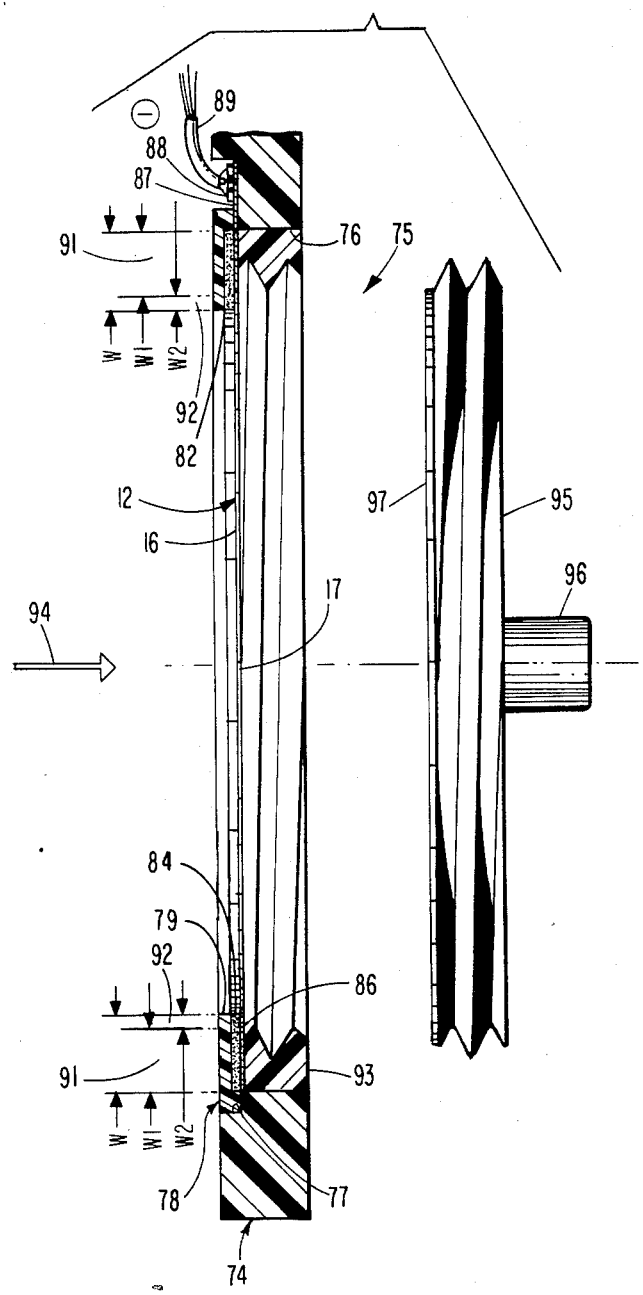
FIG. 3 is a sectional view of a wafer and apparatus for plating on an active surface of a wafer in accordance with another embodiment of the invention.

FIG. 1 illustrates a portion of a typical article 10 and FIGS. 2 and 3 illustrate a more specific article 12, said articles having first surfaces 14 and 16, respectively, which may be plated in the practice of the invention. The type of plating contemplated is electroplating, so the surfaces 14 and 16 or paths thereon should be conductive to carry current to sites to the plated. In addition, the surfaces 14 and 16 should have reasonably smooth, peripheral regions for contacting and sealing surfaces 14 and 16 in the manner intended.

Article 10 may have a second surface 15 which is typically not contacted because it is not meant to be plated. Except for the considerations mentioned, article 10 may have a random configuration and material, but the material should be amenable to electroplating.

By way of example, and without limitation, an article 12 may be a semiconductor wafer 12, and as such, may be formed from group III, IV or V materials as related to the Periodic Table of Elements. Such a wafer 12 is typically somewhat disc-like in shape and may typically be from about 75 to about 150 mm in diameter. There are two major surfaces 16 and 17 which are substantially planar and parallel to each other. Surface 16 may also be referred to as an active side 16 because a large number of electronic devices such as ICs may be formed in the surface 16. Included in such forming is the need to deposit metal features in precise miniature patterns on surface 16. Features of platinum and titanium are often delineated by oxide masking and applied by sputtering. Features of gold are typically delineated by photoresist masking and applied by electroplating. Such electroplating is facilitated in the practice of the invention.

Surface 17 may also be referred to as an inactive side 17 because devices are not normally formed in surface 17. However, an inactive surface 17 does receive treatment such as that required to build a layer of silicon nitride ($Si_3N_4$). Such a layer protects the ICs from migration of contaminants such as sodium into the devices to destroy electrical properties. A problem with silicon nitride is that it is a dielectric which prevents good contact to surface 17 for electroplating.

Articles such as the semiconductor wafers 12 may receive treatment in from about 100 to about 150 costly process steps to form the ICs in the surfaces 16. Also, the surface 17 is often etched and/or ground to remove material to thin a wafer 12 during the final manufacturing steps. Accordingly, it is important that the wafers 12 be contacted for plating in a manner which avoids chipping and splitting and consequent financial loss.

Plating on a Surface

FIG. 1 is a schematic representation of expedients for plating on a first surface 14 of an article 10 according to the invention. A conductor 18 is disposed along a peripheral edge of article 10, substantially adjacent to the first surface 14. Conductor 18 may be electrically connected by at least one bracket 20, a clip 22 and a cable 24 to the cathode terminal of a rectifier (not shown). Conductor 18 and the first surface 14 may be electrically coupled to article 10 for plating in a manner which is advantageous and believed to be novel. In a presently preferred coupling arrangement, a composite member 26 includes a plurality of elements 28 which may be wires or strips of aluminum, silver, monel or similar conductive material. Such elements 26 combine with a coupling member 32 to complete current paths in a manner which will be later described.

Composite member 26 is shown as a strip having its length dimension extending along the edges of article 10 and the conductor 18, i.e., toward a viewer in FIG. 1. However, the configuration and application of one or more composite members is not so limited in the practice of the invention. For example, there is a typically small gap between the edges of article 10 and conductor 18 and the portion of composite member 26 which spans the gap is not needed. Accordingly, a contacting expedient having a composite construction as shown in FIG. 1 could comprise two longitudinal strips and the portion running along the gap could be omitted.

Also, it is apparent that a contacting expedient having a composite construction as shown in FIG. 1 need not continuously contact conductor 18 and peripheral regions of surface 14. For example, a plurality of strips could be utilized having a length equal to approximately the width of composite member 26. The strips could extend across the conductor 18 and peripheral regions of surface 14 and be of a width and spacing to intermittently or to almost continuously contact conductor 18 and article 10. If one were to apply such composite strips to conductor 18 and a wafer 12, a view of one such strip could be depicted in FIG. 1 as an elevation view rather than a cross-section view as shown.

In accordance with the above reasoning, a contacting expedient is better described as having a first portion 27 in contact with the conductor 18 and a second portion 29 in contact with peripheral regions of surface 14 of article 10. Each of such portions have a plurality of conductive elements 28 having first ends 30 and second ends 31. The ends 30 of elements 28 in portion 27 are in contact with conductor 18. The ends 30 of elements 28 in the portion 29 are in contact with peripheral regions of the first surface 14. A problem is to electrically couple all or most of the second ends 31 of elements 28 in both portions 27 and 29 of composite member 26.

FIG. 1 shows the coupling member 32 applied along a major surface of composite member 26. Member 32 is preferably made of a good conducting material such as aluminum to contact and interconnect substantially all of the second ends 31 of the conductive elements 28. Member 32 completes a multitude of conductive paths from conductor 18 through the elements 28 of portion 27 to member 32 and therefrom through the elements 28 of portion 29 to the surface 14. Other aspects of the contacting function will be appreciated after a typical plating procedure is more fully explained.

A pump 34 is provided to draw from a source of plating solution (not shown) and to propel the solution through a funnel-like, dispersing device 36 to the surface 14 to be plated. The arrow 37 symbolizes a flow of solution into pump 34 and the arrows at the discharge depict a jet stream 38 of solution out of device 36 toward surface 14. The solution is rich in metallic ions and the force of jet stream 38 upon surface 14 continually moves spent solution away so fresh solution may wet the surface 14. Accordingly, ion exchange is facilitated and surface plating is enhanced. A problem is to complete a circuit from surface 14 to a positively charged current source.

There is disposed in jet stream 38 a grid 40 made of a material such as stainless steel which is conductive and resistant to attack by the plating solution. Grid 40 is connected by a clip 41 and a cable 42 to the anode terminal of the same rectifier (not shown) which serves conductor 18. The solution emitted from pump 34 and device 36 contacts the grid 40 and completes a current path to surface 14.

In a typical operation for plating surfaces 14, a rectifier may impress up to 12 volts over, and deliver about 200-400 milliamperes of current through, the apparatus depicted in FIG. 1. The elements 28 should be sufficient in number, cross-section and material conductivity in portions 27 and 29 to readily conduct the desired current. Wires of monel alloy, formed 0.11 mm in diameter and distributed within member 26 at a density of about 150 wires per square centimeter, are typically adequate for such plating.

The conductive elements 28 in member 26 are supported in a laterally, electrically isolated condition by a matrix 44 which is substantially nonconductive. By a matrix 44 is meant a material in which the elements 28 are embedded and thereby supported. Matrix 44 also serves a function of resiliently supporting elements 28 under repetitive cycles of compression. Matrix 44 serves a further function by intimately and uniformly contacting along surface 14 and coupling member 32 to form an hydraulic seal. Matrix 44 is selected to withstand the impinging force, temperature and composition of a given plating solution. Advantageously, matrix 44 is nonconductive to avoid plating on exposed surfaces of the composite member 26.

Typical plating solutions for gold include potassium gold cyanide as a gold carrier and chemicals for other purposes. A basic solution may include potassium hydroxide and potassium cyanide. An acid (or neutral) solution may include a phosphate and/or a citrate salt or a tartrate salt. The solution temperature may typically be maintained at from about 60° C. to about 70° C. and the impinging velocity may be from about 15 to about 35 cm./sec. For such conditions and for a surface 14 which is reasonably smooth, an adequate material for a matrix 44 is a solid silicone rubber having a Shore A Durometer compressibility rating of about 30.

FIG. 1 shows that the ends of elements 28 bear directly against contact surfaces such as against coupling member 32, conductor 18 and the surface 14. Force is exerted according to arrows 45, 46 and 47 against conductor 18, article 10 and coupling member 32, respectively, to compress matrix 44 to seal primarily against surface 14. Accordingly, provision is made to make the elements 28 longitudinally resilient to maintain contact during compression of member 26. In a simple embodiment, wire elements 28 are shaped into a wavy (or sinuous) alignment as shown in FIG. 1. Such elements 28 are longitudinally compressible and resilient. Sufficient force may be applied from the first and second ends 30 and 31, respectively, against contact surfaces that conduction of the desired current is readily achieved.

A suitable system of matrix 44 and elements 28 for a composite member 26 is sold by Tecknit EMI Shielding Products, Cranford, N.J., under the registered trademark "Electromet". Wire elements are provided in a shape similar to that shown in FIG. 1, such shape being described by the manufacturer as convoluted.

Plating on Wafers

FIGS. 2 and 3 illustrate embodiments for plating on an active surface of a wafer 12 utilizing the principles described with respect to the embodiment shown in FIG. 1. FIGS. 2 and 3 illustrate, inter alia, many practical expedients for applying pressure according to arrows 45, 46 and 47 (FIG. 1), for protecting a second surface of an article and for connecting to a current source.

Although the description which follows is directed to plating on a substantially circular, semiconductor wafer, the invention is not so limited. The embodiments shown in FIGS. 2 and 3 could readily be modified to plate on wafer-like articles which are neither circular nor made of a semiconductor material.

FIG. 2 shows a portion of a holder board 50 of a type for holding a plurality of wafers 12 in a plurality of pockets, one being shown and designated generally by the numeral 52. By a pocket 52, it is meant to include the apparatus attached to board 50 in FIG. 2 and described for plating a wafer 12. Such apparatus is shown in an open condition for description, and phantom lines are utilized to show a closed condition.

Board 50 has a recess 54 to hold a wafer support 56 which is preferably made of a moderately compressible and surface-sealing material such as teflon. Support 56 may have a peripheral ridge 57 to retain a wafer 12 and a conductor 58 made from a conductive, corrosion resistant material such as flat stainless steel plate. Conductor 58 is an annular member disposed concentrically of and adjacent the peripheral edge of a wafer 12 in the pocket 52. There is affixed to conductor 58, a bracket 59, a clip 60 and a cable 61 which may be connected to the cathode terminal of a rectifier (not shown). Conductor 58 is said to be annular because it extends around a wafer 12 and not because conductor 58 need be circular.

FIG. 2 also shows a substantially annular, composite member 62 having features similar to, and selected with the same considerations as, composite member 26 shown in FIG. 1. Member 62 is said to be substantially annular because it fits upon the annular conductor 58 and peripheral regions of surface 16. Member 62 may, but not need be, truly circular in configuration. Because of the small scale of FIG. 2, the internal features of composite member 62 will be functionally described. However, FIG. 1, and the description thereof, will be relied upon to explain construction features of member 62.

Composite member 62 has a width W at the periphery which may be theoretically divided into two portions. An outer portion 63 having a width W1 is for contacting conductor 58. An inner portion 64 having a width W2 is for contacting peripheral regions of surface 16 of a wafer 12. Each of such portions 63 and 64 have a substantially nonconductive matrix supporting a plurality of conductive elements having first and second ends. The first ends of the outer portion 63 are for contacting the conductor 58. The first ends of the inner portion 64 are for contacting the surface 16. The matrix and the conductive elements are similar to, and are selected with the same considerations as, the matrix 44 and the elements 26 shown in FIG. 1.

FIG. 2 shows the composite member 62 and a coupling member 66 supported by an annular flange 67 on a ring structure often referred to as a masking ring 68. Coupling member 66 is advantageously protected from corrosion by flange 67 and ring 68. Member 66 serves the same function as coupling member 32 shown in FIG. 1. Member 66 is a substantially annular (but not necessarily circular) member in contact with and interconnecting the second ends of the conductive elements in the composite member 62. Member 66 is similar to, and is selected with the same considerations as, member 32 shown in FIG. 1.

It will be appreciated that a semiconductor wafer 12 may have a multitude of expensive ICs formed in an active surface 16 whereon all useful surface is highly prized. Accordingly, composite member 62 serves a function of outlining a central portion of surface 16 to be plated. Member 62 also seals off narrow peripheral regions from wetting and plating, a function similar to masking. An arrow 70 is provided to designate an approximate direction of a jet stream of plating solution which enters ring 68 and impinges upon a wafer 12 in pocket 52.

Masking ring 68 is pivotally supported from board 50 by a hinge assembly 69. Ring 68 and hinge 69 serve as a means for removably applying (with coupling member 66 attached) the composite member 62 to the conductor 58 and peripheral regions of the active surface 16. Hinge assembly 69 may also provide an interference fit between member 62 and the conductor 58 and a wafer 12. Also, there are provided preferably two camming lugs 71 (only one shown in FIG. 2) located adjacent the periphery of the masking ring 68. When a wafer 12 is placed in pocket 52, the ring 68 is pivoted to bring composite member 62 into an interference engagement upon the wafer. Then the lugs 71 are rotated to cam upon and draw ring 68 toward the board 50. The hinge 69 and lugs 71 cooperate to compress, with coupling member 66 attached, the composite member 62 to the wafer 12 and conductor 58. Such compression assists member 62 in sealing the active surface 16. The compression is also sufficient to longitudinally force the first and second ends of conductive elements in member 62 against contact surfaces of coupling member 66 and conductor 58 and a wafer 12 to conduct a desired current for plating.

FIG. 3 shows a portion of another holder board 74, also of a type for holding a plurality of wafers 12 in a plurality of pockets, one being shown and designated by the numeral 75. Pocket 75 is formed by initially cutting a bore 76 and a counterbore 77 in the board 74. There is inserted within and affixed to the counterbore 77 an annular member 78 having a substantially annular ledge 79. Ledge 79 is said to be substantially annular because it extends around pocket 75 and has an open center portion. However, ledge 79 need not be circular and may have irregular features in cooperatively serving a masking function to be explained later.

Ledge 79 supports (or retains), in the order of placement, a coupling member 82 attached to a composite member 84 and a conductor 86. There is disposed within the conductor 86, a wafer 12 having a surface 16 and peripheral regions of such surface are contacted to composite member 84. The conductor 86 will be described first to follow the order of description of apparatus in FIG. 2.

Conductor 86 may be made from a conductive, corrosion resistant material such as a flat stainless steel plate. Conductor 86 is an annular member disposed concentrically of, and adjacent to, the peripheral edge of a wafer 12 in the pocket 75. There is affixed to conductor 86, a tab 87, a clip 88 and a cable 89 which may be connected to the cathode terminal of a rectifier (not shown). Conductor 86 is said to be annular because it extends around a wafer 12 and not because conductor 86 need be circular.

The composite member 84 shown in FIG. 3 is a substantially annular member having features similar to, and selected with the same considerations as, composite member 26 shown in FIG. 1. Member 84 is said to be substantially annular because it fits against the annular conductor 86 and peripheral regions of surface 16. Member 84 may, but need not be, truly circular in configuration. Because of the small scale of FIG. 3, the internal features of composite member 84 will be functionally described and FIG. 1 and the description thereof will be relied upon to explain construction features.

Composite member 84 has a width W at the periphery which may theoretically be divided into two portions. An outer portion 91 having a width W1 is for contacting conductor 86. An inner portion 92 having a width W2 is for contacting peripheral regions of surface 16 of a wafer 12.

Each of such portions 91 and 92 have a substantially nonconductive matrix supporting a plurality of conductive elements having first and second ends. The first ends of the outer portion 91 are for contacting the conductor 86. The first ends of the inner portion 92 are for contacting the surface 16. The matrix and the conductive elements are similar to, and are selected with the same considerations as, the matrix 44 and the elements 26 shown in FIG. 1.

The coupling member 82 shown in FIG. 3 is advantageously protected from corrosion by being trapped between the ledge 79 and composite member 84. Also, the coupling member 82, the composite member 84 and the conductor 86 are held in place by a threaded insert 93 affixed to bore 76. Member 82 serves the same function as coupling member 32 shown in FIG. 1. Member 82 is a substantially annular (but not necessarily circular) member in contact with and interconnecting the second ends of the conductive elements in the composite member 84. Member 82 is similar to, and selected with the same considerations as member 32, shown in FIG. 1.

FIG. 3 shows that composite member 84 and the ledge 79 cooperate to outline a portion of active surface 16 for plating. Such plating is facilitated by a jet stream of solution applied according to arrow 94. The apparatus in FIG. 3 does not have a hinged closure so other means are provided for holding wafer 12 firmly in pocket 75.

As shown in FIG. 3, a plug 95 is provided for insertion into pocket 75 and threads are provided on plug 95 to engage the threads of insert 93. A handle portion 96 is affixed to plug 95 to exert turning force and a pad 97, preferably of a lubricative plastic such as teflon or nylon, is provided to contact the inactive side 17 of a wafer 12. Pressure is applied via the plug 95 to compress the wafer 12 and conductor 86 against composite member 84, the coupling member 82 and ledge 79. Such compression assists member 84 in sealing against the active surface 16. The compression is also sufficient to longitudinally force the first and second ends of conductive elements in the composite member 84 against contact surfaces of conductor 86 and a wafer 12 to conduct a desired current for plating.

There have been illustrated herein certain practical embodiments of the invention and certain applications thereof. Nevertheless, it is to be understood that various modifications and refinements may be made and used which differ from these disclosed embodiments without departing from the spirit and scope of the present invention. For example, a coupling member may advantageously be made from a compliant material such as metal foil. Such foil readily conforms to a matrix in the composite member and enhances contact of the foil to the second ends of conductive elements.

What is claimed is:

1. Apparatus for plating on a first surface of an article comprising:
   a conductor disposed adjacent to the first surface and means for connecting said conductor to a source of electrical current;
   means for contacting the conductor and the first surface, including a first portion in contact with the conductor and a second portion in contact with the first surface, each of said portions having a substantially nonconductive matrix supporting a plurality of conductive elements having first and second ends, said first ends of elements in the first portion being in contact with the conductor and said first ends of elements in the second portion being in contact with the first surface; and
   at least one coupling member in contact with and interconnecting the second ends of the conductive elements in the first and second portions of the contact means thereby completing conductive paths from the conductor through the elements of the first portion to the coupling member and therefrom through the elements of the second portion to the first surface.

2. Apparatus as in claim 1 wherein the conductive elements are sufficient in number, cross-section and inherent material conductivity in the first and second portions to readily conduct current desired to plate on the first surface.

3. Apparatus as in claim 2 wherein the matrix material is selected with respect to the impinging force, temperature and composition of a given plating solution and the conditions on the first surface to compress sufficiently against and to seal peripheral regions of said first surface, thereby preventing unwanted wetting of other surfaces.

4. Apparatus as in claim 3 wherein the conductive elements are longitudinally, resiliently shaped to sufficiently force the first and second ends against contact surfaces such that conduction of the desired current is readily achieved.

5. Apparatus for plating on a first surface of a wafer, comprising:
- a holder board having at least one pocket for holding a wafer therein;
- an annular conductor disposed concentrically of, and adjacent the peripheral edge of, a wafer in the pocket and means for connecting the conductor to a current source;
- a substantially annular, composite member having a first portion for contacting the conductor and a second portion for contacting peripheral regions of the first surface of a wafer, each of said portions having a substantially nonconductive matrix supporting a plurality of conductive elements having first and second ends, said first ends of the first portion provided for contacting the conductor and said first ends of the second portion provided for contacting the first surface;
- a substantially annular coupling member in contact with and interconnecting the second ends of the conductive elements in the composite member for completing conductive paths from the conductor through the elements of the first portion to the coupling member and therefrom through the elements of the second portion to the first surface;
- means for applying, with coupling member attached, the composite member to the conductor and the peripheral regions of the first surface; and
- means for compressing the conductor and wafer, the composite member and coupling member together to sufficiently press against and thereby seal peripheral regions of the first surface and to sufficiently longitudinally force the first and second ends of the conductive elements against contact surfaces to conduct the desired current for the plating.

6. Apparatus as in claim 5 wherein the means for applying the composite member and means for compressing further comprise:
- a substantially annular masking ring for holding the coupling member and composite member;
- a hinge assembly connecting the masking ring to the holder board for removably applying the masking ring to the pocket, and with coupling member attached, the composite member to the conductor and a wafer held in the pocket; said hinge assembly providing an interference fit between the composite member and the conductor and wafer; and
- at least one camming lug disposed on the holder board at the periphery of the masking ring to draw the ring toward the board and compress, with the coupling member attached, the composite member to the wafer and the conductor.

7. The apparatus as in claim 5 wherein the means for applying the composite member and the means for compressing further comprise:
- inserted within the pocket, an annular member having a substantially annular ledge to support the coupling member with the composite member thereagainst, the conductor and a wafer being applied against the composite member; and
- a plug for insertion into the pocket and means for applying pressure via the plug to compress the wafer and conductor against the composite member, the coupling member and the ledge.

8. The apparatus as in claim 5 wherein the coupling member is sufficiently compliant to conform to the matrix in the composite member and contact the conductive elements.

9. A method of plating on a first surface of an article comprising:
- disposing a conductor along the first surface and connecting said conductor to a source of electrical current;
- contacting the conductor and the first surface with means including a first portion to the conductor and a second portion to the first surface, each of said portions having a substantially nonconductive matrix supporting a plurality of conductive elements having first and second ends, said first ends of the first portion being contacted to the conductor and said first ends of the second portion being contacted to the first surface; and
- contacting at least one coupling member to and interconnecting the second ends of the conductive elements in the first and second portions thereby completing conductive paths from the conductor through the elements of the first portion of the coupling member and therefrom through the elements of the second portion to the first surface.

10. A method as in claim 9 wherein contacting the conductor and the first surface further comprises:
- contacting with conductive elements that are sufficient in number, cross-section and inherent material conductivity in the first and second portions to readily conduct current desired to plate on the first surface.

11. A method as in claim 10 wherein contacting the conductor and the first surface further comprises:
- contacting with matrix material selected with respect to the impinging force, temperature and composition of a given plating solution and the conditions on the first surface to compress sufficiently against and to seal peripheral regions of said first surface, thereby preventing unwanted wetting of other surfaces.

12. A method as in claim 11 wherein contacting the conductor and the first surface further comprises:
- contacting with conductive elements that are longitudinally, resiliently shaped to sufficiently repeatably force the first and second ends against contact surfaces such that conduction of the desired current is readily achieved.

* * * * *

UNITED STATES PATENT AND TRADEMARK OFFICE
CERTIFICATE OF CORRECTION

PATENT NO. : 4,500,394
DATED : February 19, 1985
INVENTOR(S) : J. S. RIZZO

It is certified that error appears in the above—identified patent and that said Letters Patent is hereby corrected as shown below:

Column 1, line 31, "there is a disposed" should read --there is disposed--. Column 5, line 15, first and second occurrence, "C." should read --C--. In the claims, Claim 9, Column 10, line 43, "portion of the" should read --portion to the--.

Signed and Sealed this

Sixteenth Day of July 1985

[SEAL]

Attest:

DONALD J. QUIGG

Attesting Officer

Acting Commissioner of Patents and Trademarks